US009564375B2

(12) United States Patent
Mann et al.

(10) Patent No.: US 9,564,375 B2
(45) Date of Patent: Feb. 7, 2017

(54) STRUCTURES AND METHODS FOR EXTRACTION OF DEVICE CHANNEL WIDTH

(71) Applicant: GLOBALFOUNDRIES Inc., Grand Cayman (KI)

(72) Inventors: Randy Mann, Milton, NY (US); Sandeep Puri, Clifton Park, NY (US); Sonia Ghosh, Fishkill, NY (US); Anuj Gupta, Clifton Park, NY (US); Xusheng Wu, Ballston Lake, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 741 days.

(21) Appl. No.: 14/054,040

(22) Filed: Oct. 15, 2013

(65) Prior Publication Data
US 2015/0102826 A1 Apr. 16, 2015

(51) Int. Cl.
*G06F 17/50* (2006.01)
*H01L 21/66* (2006.01)

(52) U.S. Cl.
CPC ........... *H01L 22/14* (2013.01); *G06F 17/5063* (2013.01); *G06F 17/5068* (2013.01); *G01B 2210/56* (2013.01)

(58) Field of Classification Search
CPC .................................................. G06F 17/5068
USPC .................................................. 716/132–135
See application file for complete search history.

(56) References Cited

U.S. PATENT DOCUMENTS

| | | | | |
|---|---|---|---|---|
| 5,446,676 A * | 8/1995 | Huang | ................ | G06F 17/5022 703/17 |
| 5,773,317 A * | 6/1998 | Wu | ........................ | H01L 22/34 438/14 |
| 6,246,973 B1 * | 6/2001 | Sekine | ................ | G06F 17/5036 703/13 |
| 6,584,599 B2 * | 6/2003 | Fujii | ................... | G06F 17/5081 716/112 |
| 6,727,724 B2 * | 4/2004 | Yamaguchi | ........ | G01R 31/2621 324/719 |
| 7,514,940 B1 * | 4/2009 | Bu | ...................... | G01R 31/2621 257/296 |
| 7,730,432 B1 * | 6/2010 | Gupta | ................. | G06F 17/5068 716/135 |
| 7,844,927 B2 * | 11/2010 | Wu | ...................... | G06F 17/5036 703/14 |
| 8,806,419 B2 * | 8/2014 | Haensch | ................. | G06F 17/50 716/106 |
| 8,972,917 B1 * | 3/2015 | Lu | ........................ | G06F 17/5036 716/112 |
| 9,209,167 B2 * | 12/2015 | Lu | ........................ | H01L 27/0207 |
| 2002/0167034 A1 * | 11/2002 | Yamaguchi | ............. | H01L 22/12 257/296 |
| 2002/0188913 A1 * | 12/2002 | Fujii | ................... | G06F 17/5081 716/112 |
| 2005/0027501 A1 * | 2/2005 | Chen | ................... | G06F 17/5036 703/14 |

(Continued)

*Primary Examiner* — Stacy Whitmore
(74) *Attorney, Agent, or Firm* — Ditthavong & Steiner, P.C.

(57) ABSTRACT

Methods and design structures for extraction of transistor channel width are disclosed. Embodiments may include determining effective channel widths of transistors of a plurality of integrated circuits as a function of drawn channel widths of the transistors, and determining a target channel width for a target transistor based on the effective channel widths.

18 Claims, 5 Drawing Sheets

(56) References Cited

U.S. PATENT DOCUMENTS

| | | | | |
|---|---|---|---|---|
| 2008/0062596 | A1* | 3/2008 | Miller | H02H 9/046 361/56 |
| 2008/0177523 | A1* | 7/2008 | Wu | G06F 17/5036 703/14 |
| 2011/0022997 | A1* | 1/2011 | Yeh | G06F 17/5081 716/106 |
| 2012/0011479 | A1* | 1/2012 | Moroz | H01L 21/266 716/54 |
| 2012/0117519 | A1* | 5/2012 | Parikh | G06F 17/5036 716/53 |
| 2013/0042216 | A1* | 2/2013 | Loh | G06F 17/5068 716/119 |
| 2013/0239077 | A1* | 9/2013 | Wang | G06F 17/5068 716/111 |
| 2014/0201700 | A1* | 7/2014 | Haensch | G06F 17/50 716/136 |
| 2015/0089464 | A1* | 3/2015 | Lu | G06F 17/5036 716/112 |
| 2015/0187655 | A1* | 7/2015 | Parikh | H01L 22/34 438/18 |
| 2015/0279831 | A1* | 10/2015 | Lu | H01L 27/0207 716/110 |

* cited by examiner

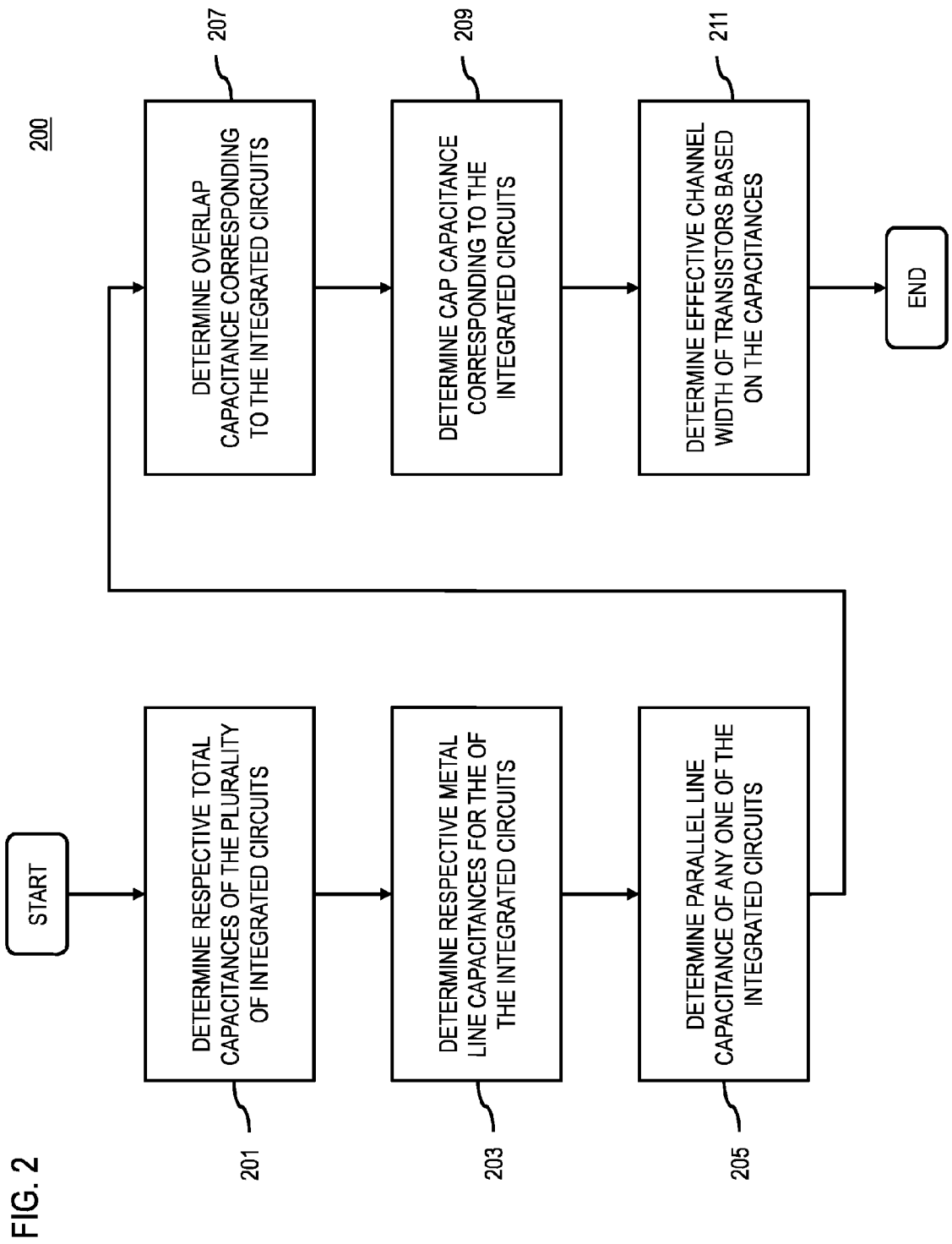

STRUCTURES AND METHODS FOR EXTRACTION OF DEVICE CHANNEL WIDTH

TECHNICAL FIELD

The present disclosure relates to determining transistor channel widths. The present disclosure is particularly applicable to determining transistor channel widths for 20 nanometer (nm) technology nodes and beyond.

BACKGROUND

As semiconductor devices continue to advance and dimensions of the devices continue to shrink, accurately manufacturing the device dimensions becomes increasingly more important, particularly for 20 nm technology devices and beyond. Certain challenges arise in manufacturing such advanced devices, such as ensuring that drawn dimensions in the design stage result in desired dimensions after manufacturing. For certain devices (e.g., static random-access memory (SRAM), embedded random-access memory (eDRAM), and read-only memory (ROM)), precise control of transistor channel width is critical for both performance and obtaining functional yield targets. Further, differences between drawn transistor channel widths and manufactured, effective channel widths may be upwards of 25%, such as a 14 to 15 nm difference between drawn and effective channel widths for SRAM devices. Yet, there is currently no way to extract the change in transistor channel width between design and manufacturing that is cost effective and does not destroy the device, particularly for 20 nm technology devices and beyond.

A need, therefore, exists for a cost effective methodology and an apparatus for accurate extraction of transistor channel width.

SUMMARY

An aspect of the present disclosure is a method for electrical measurement of manufactured device channel widths.

Another aspect of the present disclosure is design structures for extraction of manufactured device channel width through electrical measurement.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including determining effective channel widths of transistors of a plurality of integrated circuits as a function of drawn channel widths of the transistors, and determining a target channel width for a target transistor based on the effective channel widths.

An aspect of the present disclosure include determining respective total capacitances of the plurality of integrated circuits between gate nodes and shorted source, drain, and/or substrate nodes of the transistors, and determining the effective channel widths based, at least in part, on the respective total capacitances. Another aspect includes transistors for each integrated circuit having a single drawn channel width, and the single drawn channel width varies between the plurality of integrated circuits. Another aspect includes each transistor including a gate dielectric layer, with the gate dielectric layer varying between groups of the plurality of integrated circuits. Additional aspects include determining overlap capacitance between the gate node and the source node and/or the drain node corresponding to the plurality of integrated circuits, and determining the effective channel widths based, at least in part, on the overlap capacitance. Additional aspects include determining respective metal line capacitances between metal lines and substrates, without gate, source, and drain contacts for the transistors, of the plurality of integrated circuits, and determining the effective channel widths based, at least in part, on the respective metal line capacitances. Further aspects include determining the PC end-cap or "cap" capacitance between a gate poly endcap and a substrate corresponding to the plurality of integrated circuits, determining parallel line capacitance between the gate poly endcap and trench silicide lines of any one of the plurality of integrated circuits, and determining the effective channel widths based, at least in part, on the cap capacitance and the parallel line capacitance. Further aspects include determining gate currents of the transistors of the plurality of integrated circuits, determining lengths of channels of the transistors of the plurality of integrated circuits, and determining the effective channel widths based on the gate currents and the lengths of the channels.

Another aspect of the present disclosure is an apparatus including: at least one processor, and at least one memory including computer program code for one or more programs, the at least one memory and the computer program code configured to, with the at least one processor, cause the apparatus to perform at least the following, determine effective channel widths of transistors of a plurality of integrated circuits as a function of drawn channel widths of the transistors, and determine a target channel width for a target transistor based on the effective channel widths.

Aspects include the apparatus being further caused, at least in part, to determine respective total capacitances of the plurality of integrated circuits between gate nodes and shorted source, drain, and/or substrate nodes of the transistors, and determine the effective channel widths based, at least in part, on the respective total capacitances. Another aspect includes transistors for each integrated circuit having a single drawn channel width, and the single drawn channel width varies between the plurality of integrated circuits. Another aspect includes each transistor including a gate dielectric layer, with the gate dielectric layer varying between groups of the plurality of integrated circuits. Further aspects include the apparatus being further caused, at least in part, to: determine overlap capacitance between the gate node and the source node and/or the drain node corresponding to the plurality of integrated circuits, and determine the effective channel widths based, at least in part, on the overlap capacitance. Still another aspect includes the apparatus being further caused, at least in part, to determine respective metal line capacitances between metal lines and substrates, without gate, source, and drain contacts for the transistors, of the plurality of integrated circuits, and determine the effective channel widths based, at least in part, on the respective metal line capacitances. Further aspects include the apparatus being further caused, at least in part, to determine cap capacitance between a gate poly endcap and a substrate corresponding to the plurality of integrated circuits, determine parallel line capacitance between the gate poly endcap and trench silicide lines of any one of the plurality of integrated circuits, and determine the effective channel widths based, at least in part, on the cap capacitance and the parallel line capacitance. Additional aspects include the apparatus being further caused, at least in part, to determine gate currents of the transistors of the plurality of integrated circuits, determine lengths of channels of the transistors of the plurality of integrated circuits, and determine the effective channel widths based on the gate currents and the lengths of the channels.

Another aspect of the present disclosure includes a method including determining respective total capacitances of a plurality of integrated circuits, each integrated circuit having bitcells with transistors having a uniform drawn channel width, with the drawn uniform channel width varying between the plurality of integrated circuits, determining respective metal line capacitances of the plurality of integrated circuits, determining a cap capacitance corresponding to the plurality of integrated circuits, determining parallel line capacitance of any one of the plurality of integrated circuits, and determining effective channel widths of the transistors of the plurality of integrated circuits based on the respective total capacitances, the respective metal line capacitances, the cap capacitance, and the parallel line capacitance.

Further aspects include determining a target channel width for designing a target transistor based on the effective channel widths. Additional aspects include determining the respective total capacitances by measuring capacitance between gate nodes and shorted source, drain, and/or substrate nodes for the plurality of integrated circuits, and determining the respective metal line capacitances by measuring capacitance between metal lines and substrates without gate, source, and drain contacts of the plurality of integrated circuits. Another aspect includes determining the parallel line capacitance by measuring capacitance between the gate poly endcap and trench silicide lines for the any one of the plurality of integrated circuits.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 2 is a flowchart of a process for determining various capacitances of integrated circuits for determining target channel widths, in accordance with an exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of changes in the channel width between the design stage and the manufacturing stage and an inability to precisely control transistor channel width attendant upon manufacturing semiconductor devices with narrow transistor channel widths. In accordance with embodiments of the present disclosure, electrical measurement of manufactured device channel widths for a number of test circuits is used to determine a correlation between drawn channel widths and effective channel widths during early stages of technology development. The correlation is then used to determine a target channel width during the design stage that will result in a known manufactured channel width.

Methodology in accordance with an embodiment of the present disclosure includes determining effective channel widths of transistors of a plurality of integrated circuits as a function of drawn channel widths of the transistors. Then, a target channel width for a target transistor is determined based on the effective channel widths.

Figure 1:
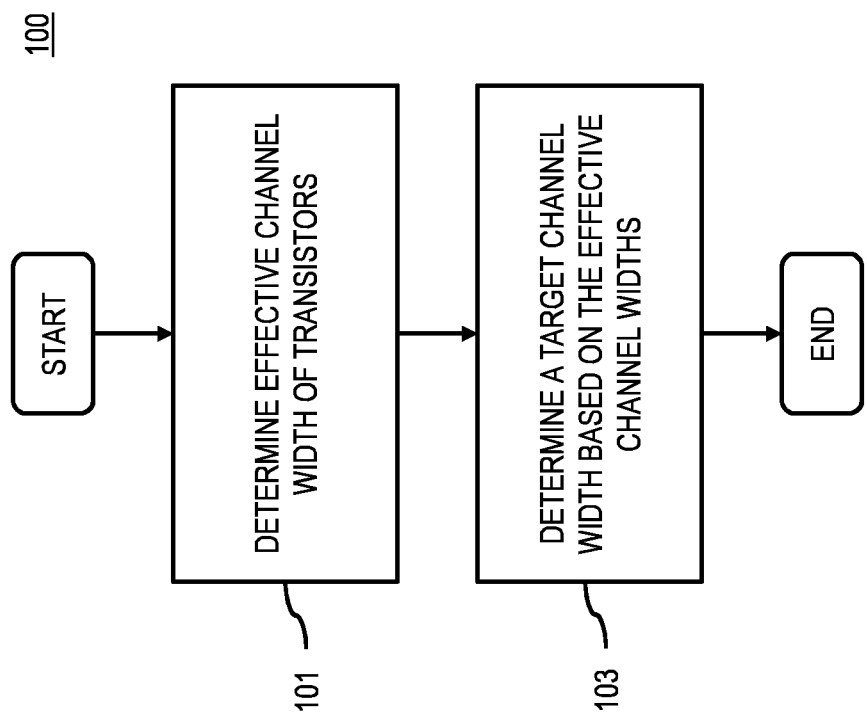
FIG. 1 is a flowchart of a process for electrically measuring manufactured device channel widths for determining target channel widths, in accordance with an exemplary embodiment.

Adverting to FIG. 1, a flowchart is shown of a process 100 for electrically measuring manufactured device channel widths for determining target channel widths, according to an exemplary embodiment. At step 101, effective channel widths of transistors of a plurality of integrated circuits are determined as a function of drawn channel widths of the transistors. A number of integrated circuits are made, each integrated circuit containing identical arrays of bitcells (e.g., SRAM, eDRAM, ROM, etc.) except that the bitcells for different integrated circuits have different transistor channel widths. The integrated circuits may each have 50,000 to 100,000 bitcells having identical transistors. Although the channel width of the transistors varies between integrated circuits, all other conditions, such as channel length, metal connections, neighboring shapes, etc., are kept as uniform as possible across all of the integrated circuits.

At step 103, after determining the effective channel widths of the transistors of the plurality of integrated circuits, a target channel width for a target transistor may be determined based on the effective channel widths. The target transistor may be for the same transistor as in the integrated circuits used in step 101, such as if the integrated circuits are SRAM, the target transistor is also for SRAM. Based on the dimensions of the effective channel widths resulting from the drawn channel widths of the transistors in the plurality of integrated circuits, accurate target channel widths may be determined for designing transistors during technology ramp-up and device modeling. Knowing the relationship between the target channel width and the effective channel width of a transistor after manufacturing allows for precise channel width control for devices where channel width control is critical for both performance and for obtaining functional yield results (e.g., SRAM, eDRAM, ROM, etc.).

Adverting to FIG. 2, another flowchart illustrates a process 200 for determining various capacitances of integrated circuits for determining target channel widths, according to an exemplary embodiment. At step 201, respective total capacitances of the plurality of integrated circuits discussed in FIG. 1 are determined. The respective total capacitances are determined by electrically measuring the capacitance between gate nodes and shorted source, drain and/or substrate nodes of the transistors within the integrated circuits.

Figure 3A:
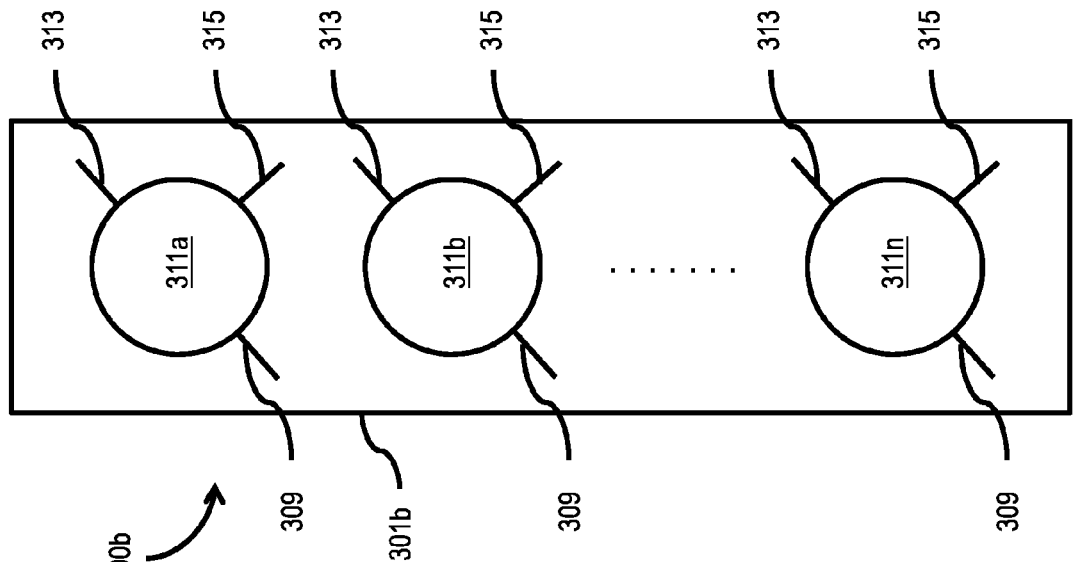
FIGS. 3A and 3B schematically illustrate design structures used in the processes of FIGS. 1 and 2, in accordance with an exemplary embodiment.

FIG. 3A illustrates a design structure 300a that may be used to determine the respective total capacitances of the plurality of integrated circuits. The design structure 300a includes a pad 301a that is electrically connected to n integrated circuits (e.g., integrated circuits 303a, 303b, ..., 303n). As discussed above, each integrated circuit 303a through 303n contains identical arrays of bitcells except that the bitcells for different integrated circuits have different transistor channel widths. The pad 301a is electrically connected through connections 305 to the gates of the transistors of integrated circuits 303a through 303n. The pad 301a is further electrically connected through connections 307 to the shorted sources and drains of the transistors of the integrated circuits 303a through 303n. The pad 301a is also electrically connected through connections 309 to the substrates of the integrated circuits 303a through 303n. Thus, the design structure 300a allows for determining the total capacitance of respective integrated circuits between gate nodes and shorted source, drain and/or substrate nodes for n integrated circuits. Further, as discussed above, each of the n integrated circuits may have identical transistors except for different channel widths between the integrated circuits. Thus, the design structure 300a allows for determining respective total capacitances of the integrated circuits varying based on transistor channel widths.

Although the conditions of the transistors are described above as being as uniform as possible, except for transistor channel width, alternatively, in addition to varying transistor channel widths, the gate dielectric layer of the transistors may vary between groups of integrated circuits. Alternatively, groups of integrated circuits may have transistors with identical transistor channel widths but with different gate dielectric layers. The gate dielectric layers may vary between thicknesses, types of oxides used, single or multiple different oxides used in the same gate oxide layer (e.g., multi-layers), and the like. Respective total capacitances may be determined for the integrated circuits with varying gate dielectric layers to further determine the effective channel width of the transistors, as discussed in more detail below.

Adverting back to FIG. 2, at step 203, respective metal line capacitances of the plurality of integrated circuits are determined. The respective metal line capacitances are determined for the plurality of integrated circuits, with the integrated circuits lacking gate, source, and drain contacts for the transistors. Thus, the metal line capacitances may be determined by using modified (mirror) integrated circuits that lack the connections between the gate and source/drain nodes. The resulting respective metal line capacitances are the capacitances, therefore, resulting only from the metal lines within the integrated circuits.

Figure 3B:
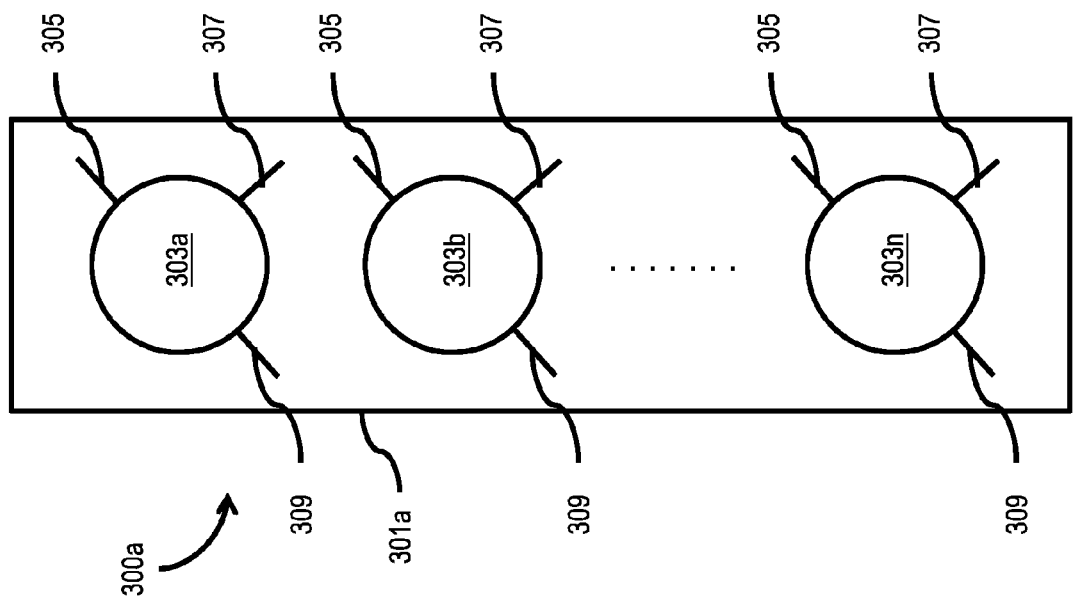

FIG. 3B illustrates a design structure 300b that may be used to determine the respective metal line capacitances of the plurality of integrated circuits. The design structure 300b includes a pad 301b that is electrically connected to n integrated circuits (e.g., integrated circuits 311a, 311b, ..., 311n). The integrated circuits 311a, 311b, ..., 311n may be the same integrated circuits as integrated circuits 303a, 303b, ..., 303n, but without the contacts to the gate, source, and drain nodes. The pad 301b is electrically connected through connections 313 to the metal lines of the transistors of the integrated circuits 311a through 311n. The pad 301b may additionally be electrically connected through connections 315 to the metal lines of the transistors of the integrated circuits 311a through 311n. The pad 301b is also electrically connected through connections 309 to the substrates of the integrated circuits 311a through 311n. Thus, the design structure 300b allows for determining the metal line capacitances of respective integrated circuits for n integrated circuits. Further, as discussed above, each of the n integrated circuits may have identical transistors except for different channel widths between the integrated circuits. Thus, the design structure 300b allows for determining metal line capacitances of the integrated circuits, without contacts to the gate, source, and drain nodes, varying based on transistor channel widths.

Adverting back to FIG. 2, at step 205, the parallel line capacitance between the gate poly endcap and trench silicide lines is determined corresponding to the plurality of integrated circuits. As known by one of ordinary skill in the art, the parallel line capacitance may be a generic capacitance determined and/or measured based on a generic structure, such as a scribe line test structure, that determines the capacitance between the gate poly endcap and the trench silicide lines corresponding to the integrated circuits. Thus, in determining the parallel line capacitance, the plurality of integrated circuits need not be tested directly. Instead, the parallel line capacitance may be determined based on the conditions of the gate poly endcap and the trench silicide lines corresponding to the integrated circuits from generic structures.

At step 207, the overlap capacitance between the gate node and the source node and/or the drain node corresponding to the plurality of integrated circuits is determined. As known by one of ordinary skill in the art, the overlap capacitance also may be a generic capacitance measured from a generic structure, such as a scribe line test structure, that determines the capacitance between the gate node and the source node and/or the drain node corresponding to the integrated circuits. Thus, in determining the overlap capacitance, the plurality of integrated circuits are not tested directly. Instead, the overlap capacitance may be determined based on the conditions of the gate node and the source node and/or drain node corresponding to the integrated circuits from generic structures.

Figure 4:
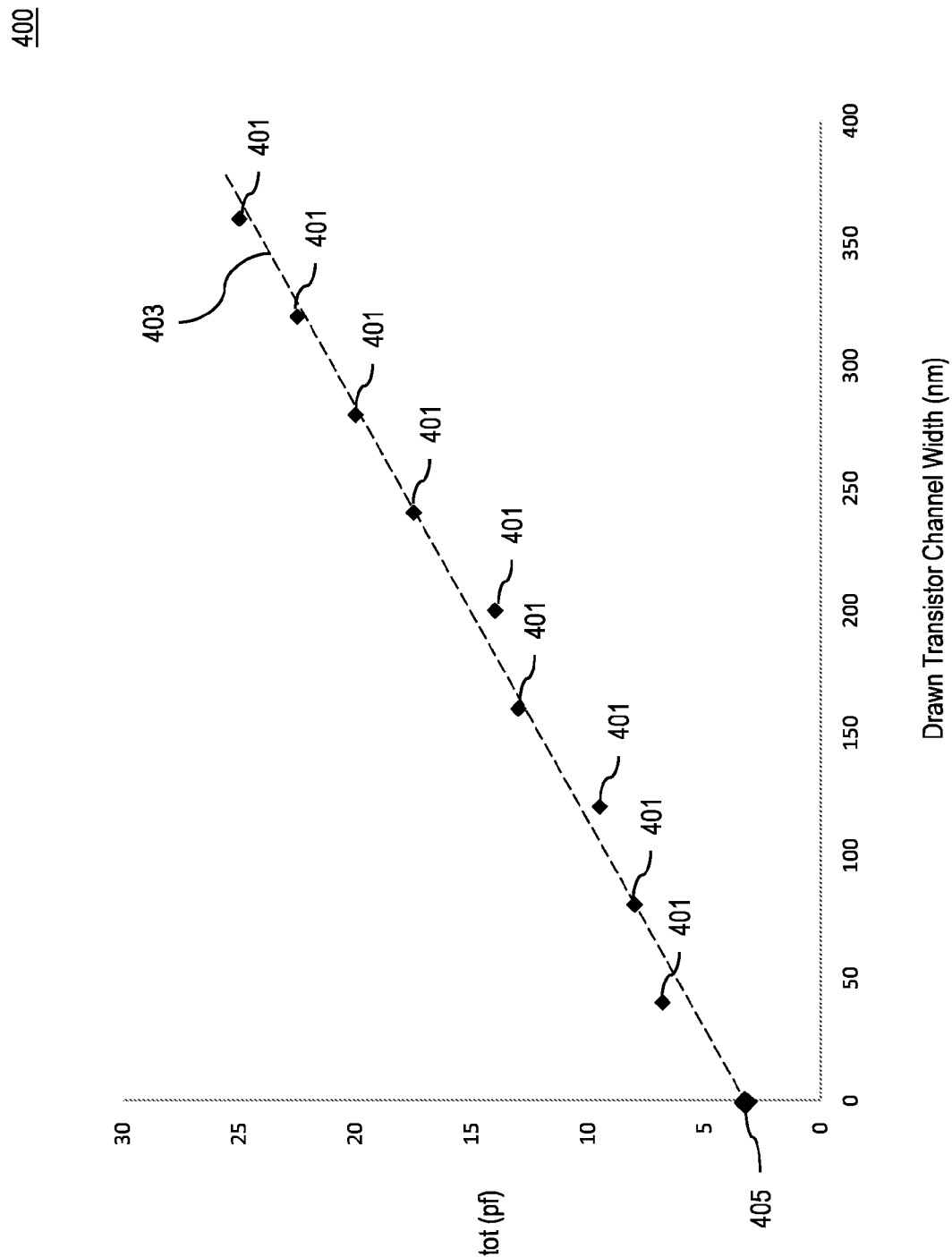
FIG. 4 is a graph of drawn transistor widths versus total capacitance for determining target channel widths, in accordance with an exemplary embodiment.

At step 209, the cap capacitance between the gate poly endcap and the substrate corresponding to the plurality of integrated circuits is determined. The cap capacitance may be determined based on the respective total capacitances described above with respect to step 201 versus the drawn transistor channel widths of the transistors of the plurality of integrated circuits. FIG. 4 illustrates a plot 400 of respective total capacitances $C_{tot}$ along the y-axis versus the drawn transistor channel widths of the transistors of the plurality of integrated circuits along the x-axis represented by data points 401. The value of the drawn transistor channel width may be in nm, and the value of the respective total capacitances may be picofarads (pf). The data points 401 and values of the x and y-axes are merely exemplary and are not intended to illustrate actual values of respective total capacitances versus drawn transistor channel widths for integrated circuits. Trend line 403 is determined based on the trend of the data points 401, with the y-intercept 405 of the trend line 403 based, at least in part, on the cap capacitance. More specifically, the total capacitance of an integrated circuit may be defined by:

$$C_{tot}=W_{eff}LC_{gate}+W_{eff}C_{ov}+2LC_{cap}+C_{m1}+C_{pcts} \quad (1)$$

where $C_{tot}$ is the total capacitance of an integrated circuit, $W_{eff}$ is the effective channel width of the transistors in the integrated circuit, L is the length of the channel, $C_{m1}$ is respective metal line capacitance of the integrated circuit, and $C_{ov}$ is the overlap capacitance, $C_{cap}$ is the cap capacitance, and $C_{pcts}$ is the parallel line capacitance corresponding to the integrated circuit. Further, $C_{gate}$ is the capacitance from the gate, which may be determined based on the dielectric or permittivity (e.g., $\in_{ox}$) of the gate dielectric (e.g., silicon dioxide) divided by the inversion layer thickness, which may be measured from a generic large area using a generic test structure, such as a scribe line test structure. When the effective channel width $W_{eff}$ is zero, i.e., the y-intercept 405 of the trend line 403, Equation 1 simplifies to:

$$C_{tot}=2LC_{cap}+C_{m1}+C_{pcts} \quad (2)$$

such that the cap capacitance $C_{cap}$ can be determined based on the respective metal line capacitance $C_{m1}$, the cap capacitance $C_{cap}$, and the length L.

Upon determining the cap capacitance $C_{cap}$, Equation 1 may be solved for the effective channel width $W_{eff}$, resulting in:

$$W_{eff} = \frac{C_{tot} - 2LC_{cap} + C_{m1} + C_{pcts}}{LC_{gate} + C_{ov}} \quad (3)$$

Thus, at step 211 of FIG. 2, for a given measured total capacitance $C_{tot}$, the effective channel width may be determined for the transistors in each of the integrated circuits used to determine the respective total capacitances. Further, knowing the drawn channel width for the transistors that resulted in manufactured transistors with the resulting total capacitances $C_{tot}$ allows for relating the drawn channel width to the effective channel width of the resulting transistor. This relationship may then be used for determining a target channel width for a target transistor based on the effective channel widths for precisely and accurately manufacturing devices while obtaining performance and functional yield targets.

As an alternative to the capacitance approach discussed above, the effective channel width of a transistor also may be determined from the dielectric tunneling current of the transistor based on:

$$I_{gate}=W_{actual}\times L\times I_{gpa} \quad (4)$$

where $I_{gate}$ is the dielectric tunneling current, $I_{gpa}$ is the gate current per unit area, which can be considered constant for a given wafer for an integrated circuit, L is the length of the transistor channel, and $W_{actual}$ is the effective channel width. Because the gate current per unit area $I_{gpa}$ is constant and the length L is known, $L \times I_{gpa}$ equates to the slope of the best fit line for the gate current $I_{gate}$ versus drawn width of the transistor channel. The dielectric tunneling current $I_{gpa}$ may then be determined for a plurality of integrated circuits with uniform conditions except for different channel widths to determine the slope. The effective channel width $W_{actual}$ can then be determined based on:

$$W_{actual}=I_{gate}/\text{slope} \quad (5)$$

Based on this approach, the effective channel width may be determined without constructing and/or modifying the integrated circuits to not include contacts for the gate, source and drain, and there is no dependence on other standard structures, such as the generic structures discussed above. Rather, the integrated circuits may be measured directly for the dielectric tunneling current. Moreover, the length of the transistor channel may be determined based on manipulating Equations 4 and 5 to provide for the slope of the gate current versus drawn transistor channel width per gate current per unit area.

Figure 5:
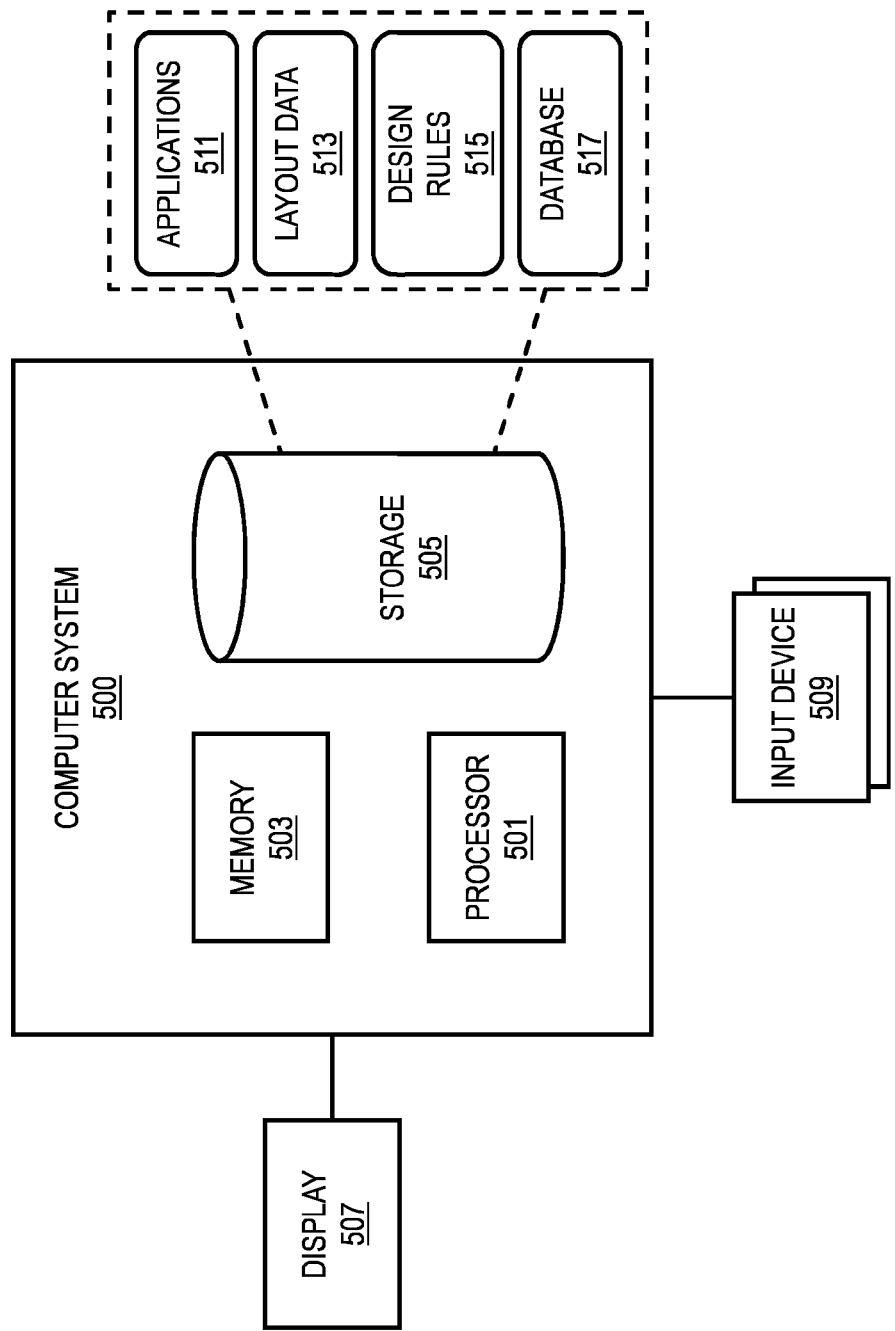
FIG. 5 schematically illustrates a computer system for implementing the processes of FIGS. 1 and 2, according to an exemplary embodiment.

The processes described herein may be implemented via software, hardware, firmware, or a combination thereof. Exemplary hardware (e.g., computing hardware) is schematically illustrated in FIG. 5. As shown, computer system 500 includes at least one processor 501, at least one memory 503, and at least one storage 505. Computer system 500 may be coupled to display 507 and one or more input devices 509, such as a keyboard and a pointing device. Display 507 may be utilized to provide one or more GUI interfaces. Input devices 509 may be utilized by users of computer system 500 to interact with, for instance, the GUI interfaces. Storage 505 may store applications 511, layout data (or information) 513, design plus rules 515, and at least one shape database (or repository) 517. Applications 511 may include instructions (or computer program code) that when executed by processor 501 cause computer system 500 to perform one or more processes, such as one or more of the processes described herein. In exemplary embodiments, applications 511 may include one or more manufacturability analysis and/or yield enhancement tools.

The embodiments of the present disclosure achieve several technical effects, including determining metal-oxide-semiconductor field-effect transistor (MOSFET) device channel widths, particularly for 20 nm technology nodes and beyond. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   measuring respective total capacitances of a plurality of transistors of integrated test circuits between gate nodes and shorted source, drain, and/or substrate nodes of the transistors of the integrated test circuits;
   based on the total capacitance measurement, determining effective channel widths of the transistors of the plurality of integrated test circuits as a function of drawn channel widths of the transistors of the integrated test circuits;

determining a target channel width for a target transistor based on the effective channel widths of the transistors of the integrated test circuits.

2. The method according to claim 1, wherein transistors for each integrated circuit have a single drawn channel width, and the single drawn channel width varies between the plurality of integrated circuits.

3. The method according to claim 1, wherein each transistor includes a gate dielectric layer, with the gate dielectric layer varying between groups of the plurality of integrated circuits.

4. The method according to claim 1, further comprising:
determining overlap capacitance between the gate node and the source node and/or the drain corresponding to the plurality of integrated circuits; and
determining the effective channel widths based, at least in part, on the overlap capacitance.

5. The method according to claim 1, further comprising:
determining respective metal line capacitances between metal lines and substrates, without gate, source, and drain contacts for the transistors, of the plurality of integrated circuits; and
determining the effective channel widths based, at least in part, on the respective metal line capacitances.

6. The method according to claim 1, further comprising:
determining cap capacitance between a gate poly endcap and a substrate corresponding to the plurality of integrated circuits;
determining parallel line capacitance between the gate poly endcap and trench silicide lines of any one of the plurality of integrated circuits; and
determining the effective channel widths based, at least in part, on the cap capacitance and the parallel line capacitance.

7. The method according to claim 1, further comprising:
determining gate currents of the transistors of the plurality of integrated circuits;
determining lengths of channels of the transistors of the plurality of integrated circuits; and
determining the effective channel widths based on the gate currents and the lengths of the channels.

8. An apparatus comprising:
at least one processor; and
at least one memory including computer program code for one or more programs,
the at least one memory and the computer program code configured to, with the at least one processor, cause the apparatus to perform at least the following:
measuring respective total capacitances of a plurality of transistors of integrated test circuits between gate nodes and shorted source, drain, and/or substrate nodes of the transistors of the integrated test circuits;
based on the total capacitance measurement, determine effective channel widths of the transistors of the integrated test circuits as a function of drawn channel widths of the transistors of the integrated test circuits; and
determine a target channel width for a target transistor based on the effective channel widths of the transistors of the integrated test circuits.

9. The apparatus according to claim 8, wherein transistors for each integrated circuit have a single drawn channel width, and the single drawn channel width varies between the plurality of integrated circuits.

10. The apparatus according to claim 8, wherein each transistor includes a gate dielectric layer, with the gate dielectric layer varying between groups of the plurality of integrated circuits.

11. The apparatus according to claim 8, wherein the apparatus is further caused, at least in part, to:
determine overlap capacitance between the gate node and the source node and/or the drain node corresponding to the plurality of integrated circuits; and
determine the effective channel widths based, at least in part, on the overlap capacitance.

12. The apparatus according to claim 8, wherein the apparatus is further caused, at least in part, to:
determine respective metal line capacitances between metal lines and substrates, without gate, source, and drain contacts for the transistors, of the plurality of integrated circuits; and
determine the effective channel widths based, at least in part, on the respective metal line capacitances.

13. The apparatus according to claim 8, wherein the apparatus is further caused, at least in part, to:
determine cap capacitance between a gate poly endcap and a substrate corresponding to the plurality of integrated circuits;
determine parallel line capacitance between the gate poly endcap and trench silicide lines of any one of the plurality of integrated circuits; and
determine the effective channel widths based, at least in part, on the cap capacitance and the parallel line capacitance.

14. The apparatus according to claim 8, wherein the apparatus is further caused, at least in part, to:
determine gate currents of the transistors of the plurality of integrated circuits;
determine lengths of channels of the transistors of the plurality of integrated circuits; and
determine the effective channel widths based on the gate currents and the lengths of the channels.

15. A method comprising:
measuring respective total capacitances of a plurality of integrated test circuits, each integrated test circuit having bitcells with transistors having a uniform drawn channel width, with the drawn uniform channel width varying between the plurality of integrated circuits;
measuring respective metal line capacitances of the plurality of integrated test circuits;
measuring a cap capacitance corresponding to the plurality of integrated test circuits;
measuring parallel line capacitance of any one of the plurality of integrated test circuits; and
determining effective channel widths of the transistors of the plurality of integrated test circuits based on the measured respective total capacitances, the respective metal line capacitances, the cap capacitance, and the parallel line capacitance.

16. The method according to claim 15, further comprising:
determining a target channel width for designing a target transistor based on the effective channel widths.

17. The method according to claim 15, comprising:
determining the respective total capacitances by measuring capacitance between gate nodes and shorted source, drain, and/or substrate nodes for the plurality of integrated circuits; and
determining the respective metal line capacitances by measuring capacitance between metal lines and substrates without gate, source, and drain contacts of the plurality of integrated circuits.

18. The method according to claim 15, comprising determining the parallel line capacitance by measuring capacitance between gate poly endcap and trench silicide lines for the any one of the plurality of integrated circuits.

\* \* \* \* \*

UNITED STATES PATENT AND TRADEMARK OFFICE
CERTIFICATE OF CORRECTION

PATENT NO. : 9,564,375 B2  
APPLICATION NO. : 14/054040  
DATED : February 7, 2017  
INVENTOR(S) : Mann et al.

Page 1 of 1

It is certified that error appears in the above-identified patent and that said Letters Patent is hereby corrected as shown below:

On the Title Page

Item [54] and in the Specification, Column 1, Line 1, delete "STRUCTURES AND METHODS FOR EXTRACTION OF DEVICE CHANNEL WIDTH" and insert --DESIGN STRUCTURES AND METHODS FOR EXTRACTION OF DEVICE CHANNEL WIDTH--

Signed and Sealed this  
Sixth Day of June, 2017

Michelle K. Lee  
*Director of the United States Patent and Trademark Office*